(12) United States Patent
Molas et al.

(10) Patent No.: US 8,252,702 B2
(45) Date of Patent: Aug. 28, 2012

(54) FABRICATION OF A MEMORY WITH TWO SELF-ALIGNED INDEPENDENT GATES

(75) Inventors: Gabriel Molas, Grenoble (FR); Thierry Baron, Saint Egreve (FR)

(73) Assignees: Commissariat à l'énergie atomique et aux énergies alternatives, Paris (FR); Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 13/091,502

(22) Filed: Apr. 21, 2011

(65) Prior Publication Data

US 2011/0300699 A1 Dec. 8, 2011

(30) Foreign Application Priority Data

Apr. 22, 2010 (FR) ..................................... 10 53076

(51) Int. Cl.
*H01L 21/31* (2006.01)
(52) U.S. Cl. ...................................................... 438/780
(58) Field of Classification Search .................... 438/780
See application file for complete search history.

(56) References Cited

U.S. PATENT DOCUMENTS

| | | | |
|---|---|---|---|
| 5,768,192 A | 6/1998 | Eitan | |
| 5,899,734 A * | 5/1999 | Lee ................................ | 438/584 |
| 5,948,470 A | 9/1999 | Harrison et al. | |
| 7,045,851 B2 | 5/2006 | Black et al. | |
| 7,057,230 B2 | 6/2006 | Tanaka et al. | |
| 7,130,223 B2 | 10/2006 | Ishimaru et al. | |
| 2004/0207025 A1 | 10/2004 | Chiba et al. | |
| 2009/0111226 A1* | 4/2009 | Chindalore .................... | 438/258 |
| 2009/0111229 A1 | 4/2009 | Steimle et al. | |
| 2009/0203205 A1 | 8/2009 | Molas et al. | |

FOREIGN PATENT DOCUMENTS

EP 2 088 618 A1 8/2009

OTHER PUBLICATIONS

French Preliminary Search Report issued Dec. 6, 2010, in Patent Application No. FR 1053076.
Krisanu Bandyopadhyay, et al., "Deposition of DNA-Functionalized Gold Nanospheres into Nanoporous Surfaces", Langmuir, vol. 22, No. 11, 2006, pp. 4978-4984.
Joy Y. Cheng, et al., "Templated Self-Assembly of Block Copolymers: Effect of Substrate Topography", Advanced Materials, vol. 15, No. 19, 2003, pp. 1599-1602.

(Continued)

*Primary Examiner* — Charles Garber
*Assistant Examiner* — Andre' C Stevenson
(74) *Attorney, Agent, or Firm* — Oblon, Spivak, McClelland, Maier & Neustadt, L.L.P.

(57) ABSTRACT

A method for making a micro-electronic non-volatile memory device provided with transistors having gates placed side by side, the method comprising the steps of:
  a) forming in a layer based on at least one first gate material lying on a support, at least one first transistor gate block and at least one sacrificial block, said first block and said sacrificial block being separated by a given space,
  b) forming in said given space a stack comprising at least one insulating layer and at least one second gate material, said gate material located in said space being intended to form a second gate block separated from the first block by said insulating layer,
  c) suppressing said sacrificial block.

12 Claims, 10 Drawing Sheets

OTHER PUBLICATIONS

Figure 1A:
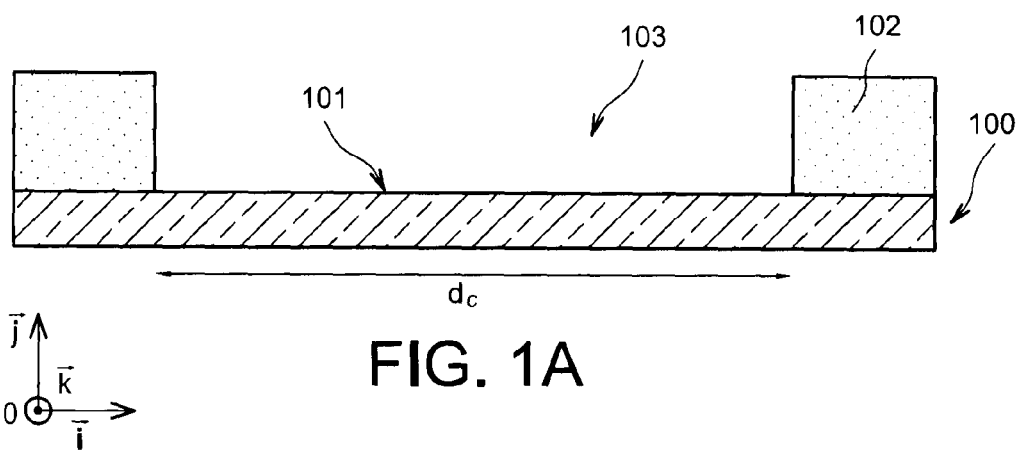

B. Hamdoun, "Morphology stability of lamellar composite magnetic materials", Science Direct, European Polymer Journal 40, 2004, pp. 1559-1564.

Sohrab Kianian, et al., "A Novel 3 Volts-Only, Small Sector Erase, High Density Flash $E^2$ Prom", Symposium on VLSI Technology Digest of Technical Papers, 1994, pp. 71-72.

Rob G. H. Lammertink, et al., "Nanostructured Thin Films of Organic-Organometallic Block Copolymers: One-Step Lithography with Poly(ferrocenylsilanes) by Reactive Ion Etching", Advanced Materials, vol. 12, No. 2, 2000, pp. 98-103.

Angelika Niemz, et al., "Fabrication of Nanoporous Templates from Diblock Copolymer Thin Films on Alkylchlorosilane-Neutralized Surfaces", LANGMUIR, vol. 22, No. 26, 2006, pp. 11092-11096.

P. Mansky, et al., "Controlling Polymer-Surface Interactions with Random Copolymer Brushes", Science, vol. 275, Mar. 7, 1997, pp. 1458-1460.

Miri Park, et al., "Block Copolymer Lithography: Periodic Arrays of $\sim 10^{11}$ Holes in 1 Square Centimeter", Science, vol. 276, May 30, 1997, pp. 1401-1404.

Thomas Thurn-Albrecht, et al., "Nanoscopic Templates from Oriented Block Copolymer Films", Advanced Materials, vol. 12, No. 11, 2000, pp. 787-791.

T. Thurn-Albrecht, et al., "Ultrahigh-Density Nanowire Arrays Grown in Self-Assembled Diblock Copolymer Templates", Science, vol. 290, Dec. 15, 2000, pp. 2126-2129.

Toshihiro Tanaka, et al., "A 512kB MONOS type Flash Memory Module Embedded in a Microcontroller", Symposium on VLSI Circuits Digest of Technical Papers, 2003, pp. 211-212.

Ting Xu, et al., "The influence of molecular weight on nanoporous polymer films", Polymer 42, 2001, pp. 9091-9095.

Yeon Sik Jung, et al., "Orientation-Controlled Self-Assembled Nanolithography Using a Polystyrene-Polydimethylsiloxane Block Copolymer", Nano Letters, vol. 7, No. 7, 2007, pp. 2046-2050.

* cited by examiner

FABRICATION OF A MEMORY WITH TWO SELF-ALIGNED INDEPENDENT GATES

TECHNICAL FIELD

The present invention relates to the field of micro-electronics and in particular to that of memories.

It relates to a method for fabricating a micro-electronic device provided with transistors having gates placed side by side. This method notably applies to the manufacturing of non-volatile memory devices.

The invention provides improvements in terms of accuracy in the positioning of the gates placed side by side, which is expressed by improved electrical performances of the non-volatile memories provided with such gates.

PRIOR ART

Erasable memory devices capable of retaining information in the absence of a power supply are called non-volatile memories.

Ideally, application of a non-volatile memory is sought, which would combine the following features: possibilities of electrical writing and erasing, low bulkiness and low cost per bit, random access, short write and read times, good endurance, but also low consumption and low power supply voltage.

With flash memory, it is possible to obtain a good compromise between all the aforementioned criteria.

Flash memories are non-volatile memories in which a memory cell may be individually programmed electrically, while a large number of memory cells, called a "block", "sector", or "page", may be electrically erased at the same time.

Flash memories combine both low bulkiness requirements of EPROM memories and requirements of being able to electrically erase EEPROM memories.

Most non-volatile memories are provided with a structure containing a site for storing charge called a floating gate.

Non-volatile memory devices of the MONOS (MONOS for "Metal Oxide Nitride Oxide Silicone") type have appeared and have replaced the traditional floating gate structure in polysilicon. In memories of the MONOS type, the charge is stored in a silicon nitride charge-trapping layer.

A memory structure called "a split-gate" which comprises both a memory transistor and a selection transistor, has also appeared. Memories of the "split-gate" type are generally programmed by a mechanism which requires the application of a selection transistor, the gate of which is placed adjacent to that of the memory transistor.

With such a structure it is possible to obtain an improved programming rate and reduced consumption.

One of the difficulties in applying these memories relates to the accuracy of the positioning of the gates relatively to each other. The gates are generally made by successive photolithographies. Poor control of the positions with respect to each other of the gates placed side by side, is expressed by poor control of the electric characteristics of the memory transistor, and therefore of the performances of the memory.

When a memory structure called a "split-gate" is applied, accurate control of the position of the gates placed side by side is required.

Document U.S. Pat. No. 7,130,223 discloses a method for making a transistor memory storage device provided with a parallelepipedal gate placed adjacent to another gate, having a rounded shape, similar to that of a spacer.

The making of a device provided with such a gate having a rounded profile poses problems of gate dimensional accuracy notably for defining the contacts.

The problem is posed of finding a novel method for making a memory device provided with transistors having gates placed side by side, with accurate positioning of the gates and accurate definition of the gate patterns.

DISCUSSION OF THE INVENTION

The invention relates to a method for making a micro-electronic non-volatile memory device provided with transistors having gates placed side by side, the method comprising the steps of:

a) forming in a layer based on a first gate material lying on a support, at least one first transistor gate block and at least one sacrificial block, said first block and said sacrificial block being separated by a given space, b) filling said given space with a stack comprising an insulating layer and a second gate material, said second gate material in said space forming another gate block separated from the first block by said insulating layer, c) suppressing said sacrificial block.

A memory with two independent gates having controlled dimensions may thereby be made.

The gate block and the sacrificial block are made during step a), with which it is possible to control the size of the empty space between these blocks, in which a block of another gate is formed in step b).

According to the invention, the method further comprises, before step a), the steps of:

forming a masking layer based on a diblock copolymer above the layer based on said first gate material, selectively removing in the masking layer based on a diblock polymer, blocks based on a polymer forming said diblock copolymer, so as to retain at least one given masking pattern and at least one other given masking pattern separated by a given distance of said given pattern, said masking patterns being based on another polymer forming said diblock copolymer, Said first gate block an said sacrificial block being formed at step a) by etching said layer of said first gate material through said given pattern and said other given pattern.

By using a diblock copolymer for forming masking patterns through which the first gate material will be etched, the positioning of said first gate block may be accurately controlled with respect to said sacrificial block formed in said first gate material and said other gate block. Said given space is thereby controlled accurately and therefore the dimensioning of the formed gate by filling said given space.

One also controls accurately the positioning of the sacrificial block (s) formed in the first gate material.

A precise positioning of the sacrificial(s) block(s) may permit, during later steps of the method, to remove these blocks by etching through a mask while having a lesser constraint on the positioning of this mask.

With the diblock copolymer it is also possible to make gates of small size, for example of the order of 15 nm.

The given pattern and said other given pattern may have a parallelepipedal shape.

The diblock copolymer may be selected from one of the following materials: PS-b-PMMA, or PS-b-PI or PS-b-PB.

According to a possible application, the insulating layer may be formed with a stack of layers comprising at least one dielectric layer and at least one charge storage layer.

The stack may for example be a trilayer formed:

with at least one first dielectric material layer, with at least one charge storage layer formed on said first dielectric material layer, with at least one second dielectric material layer formed on said charge storage layer.

Step b) may comprise the steps of:

conformable deposition of said insulating layer on said blocks of said first gate material, deposition of said second gate material so as to fill said given space.

In one possible implementation, the method can include, between step b) and step c), the steps of formation of at least one mask covering said first gate block and said second gate block, the mask being formed to, cover part of the sacrificial block on one side of the first gate block and extends beyond another side of the first gate block, of a prescribed distance $\Delta$ less than said given distance $l_2$ successive etchings through the mask, of the second gate material, the insulating layer, and possibly a hard mask layer.

The sacrificial block may then be removed in step c) by etching through said mask.

With such a mask, the tolerance of misalignment is greater than in the prior art methods. This tolerance depends on the size of the gate that one wants to form.

In one possible implementation of the method, the layer based on the first gate material may be formed on a gate dielectric layer formed on said support. The diblock copolymer layer may then be formed on a hard mask layer formed on said first gate material layer.

The etching in step a) being realized through the hard mask, the method further comprising between step a) and step b), withdrawal of the gate dielectric layer between the first block and said sacrificial block by etching through said hard mask.

The hard mask layer can serve both to protect first gate material blocks in step a) and as an etch mask.

According to a possible application, the method may comprise between step b) and step c):

the formation of at least one mask lying on said first gate block and on a portion of the sacrificial block, the mask covering said second gate block, successive etchings through the mask, of the second gate material, of the insulating layer, and of the hard mask layer, the sacrificial block being removed in step c) by etching through said mask.

The method may further comprise, after step c), the steps for:

removing said mask, partially removing the insulating layer, the insulating layer being retained between said first block and said other gate block and under said other gate block.

According to one possibility, step a) may comprise the formation in said layer based on said first gate material lying on said support, of at least one second transistor gate block, said second block and said sacrificial block being separated by another given space, said sacrificial block being located between said first block and said second gate block. In this case, step b) may comprise the formation in said other given space of said stack comprising said insulating layer and said second gate material, said gate material located in said other space forming a gate block, placed adjacent to said second block and separated from said second block by said insulating layer.

According to a possible application of the method, in which said other gate block placed adjacent to the first gate block is a gate block of a first memory storage transistor, said gate block placed adjacent to the second gate block is a gate block of a second memory storage transistor and is juxtaposed to said other gate block, the method further comprising: the formation of a common contact area between the first memory storage transistor and said second memory storage transistor.

A device such as for example a NOR flash memory cell in which a source line is common to the sources of two adjacent memory transistors, may thereby be made.

SHORT DESCRIPTION OF THE DRAWINGS

Figure 1B:
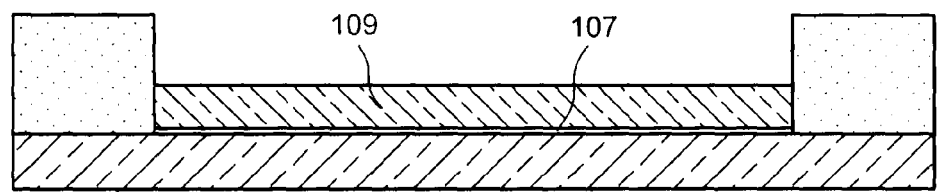
Figure 1C:
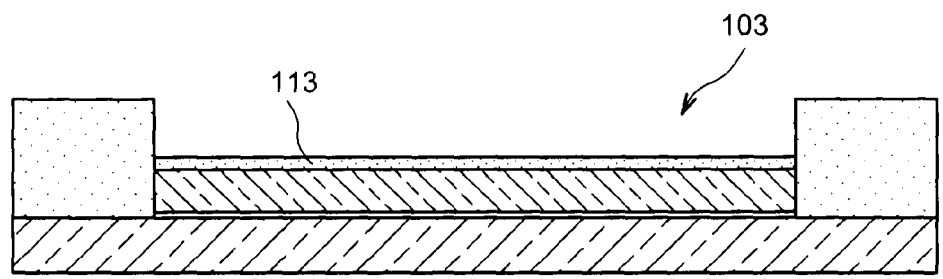
Figure 1D:
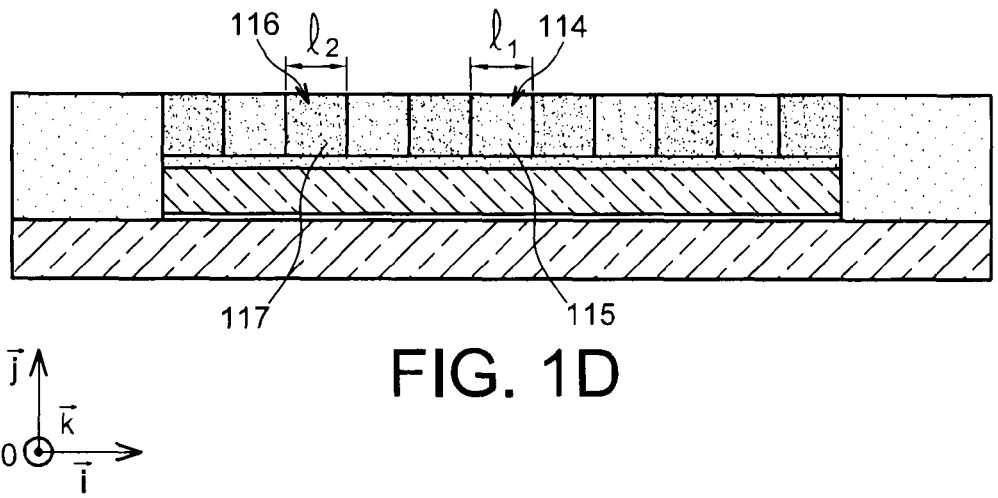
Figure 1E:
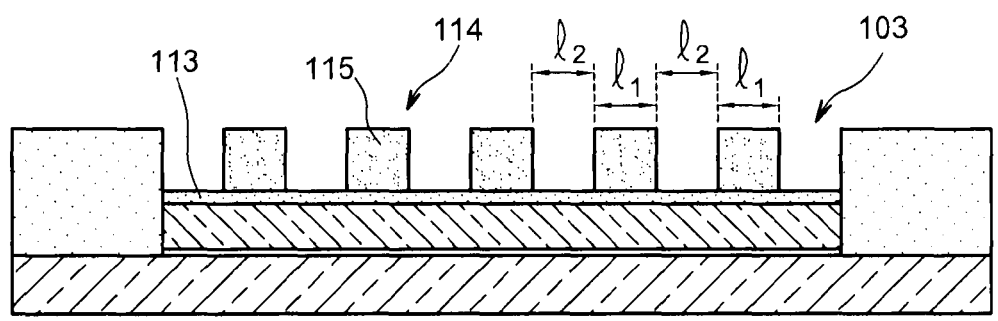
Figure 1F:
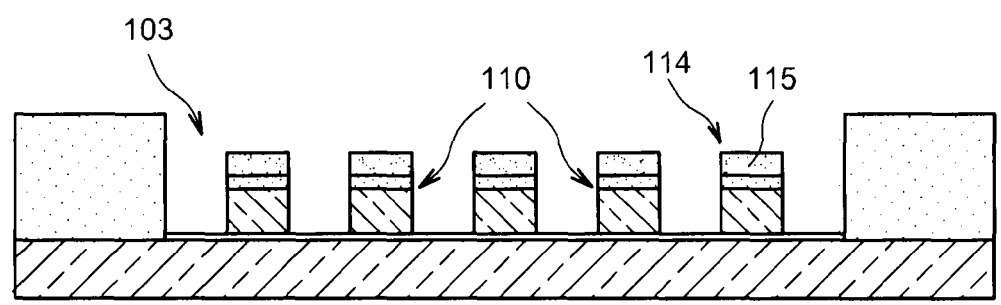
Figure 1G:
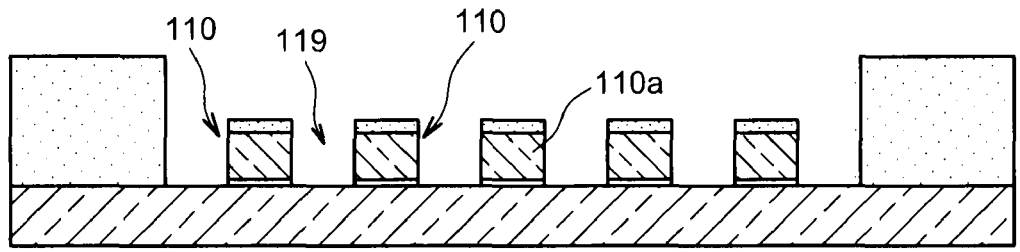
Figure 1H:
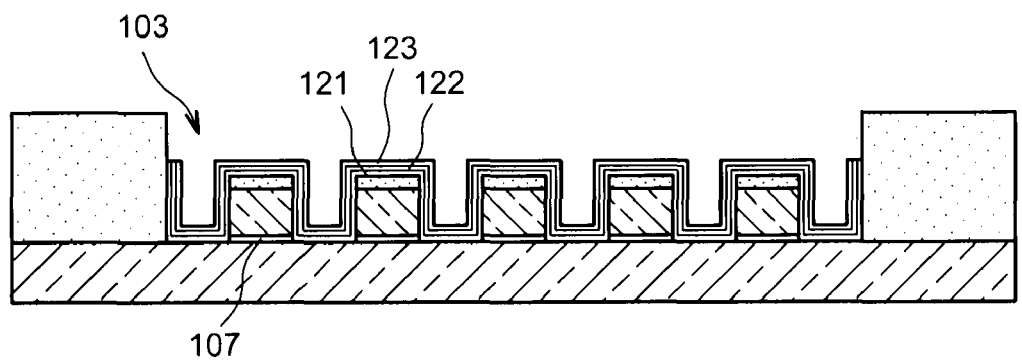
Figure 1I:
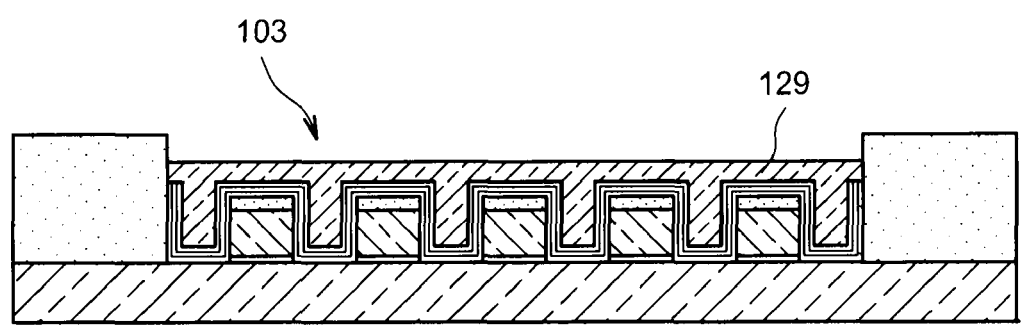
Figure 1J:
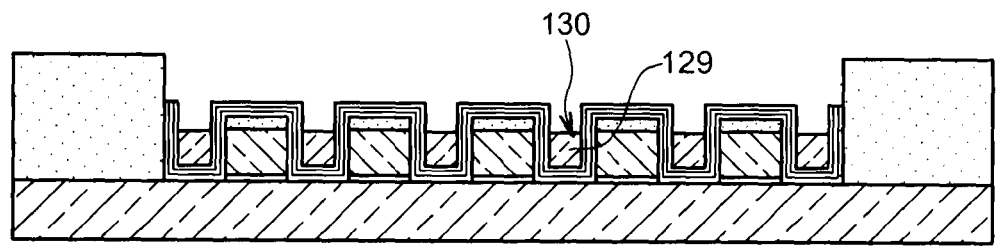
Figure 1K:
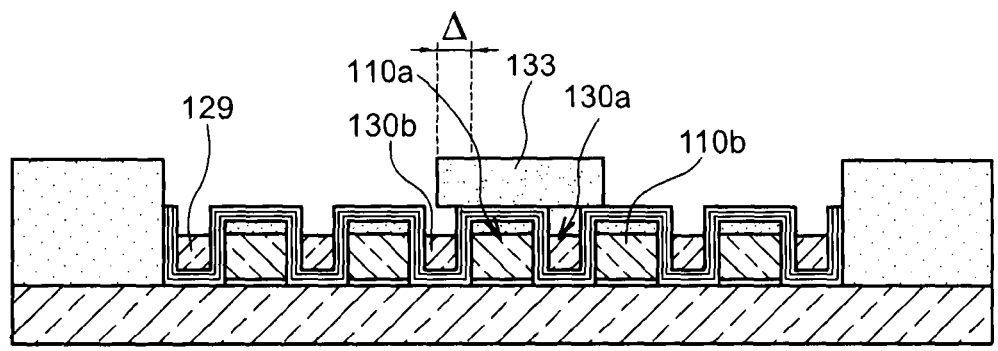
Figure 1L:
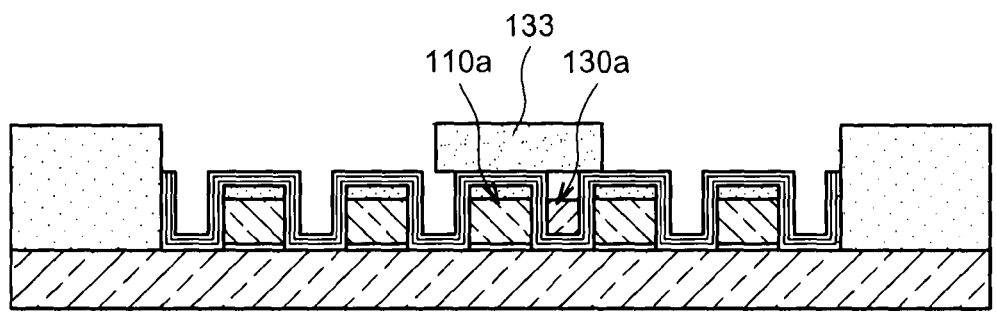
Figure 1M:
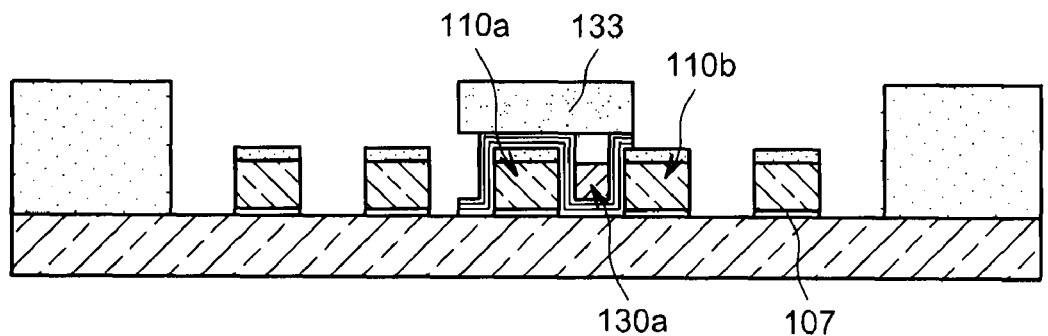
Figure 1N:
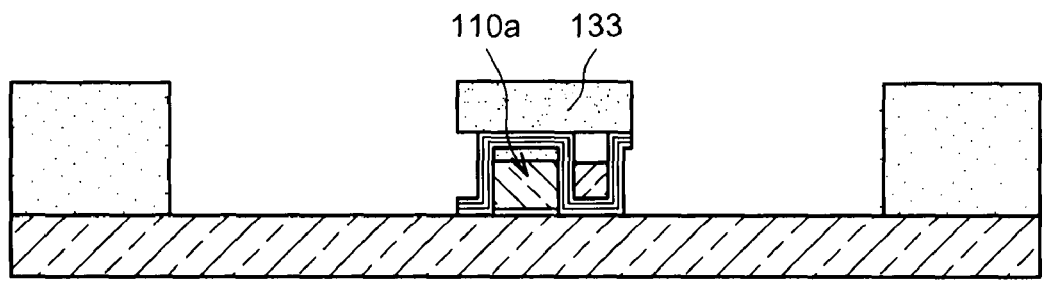
Figure 1O:
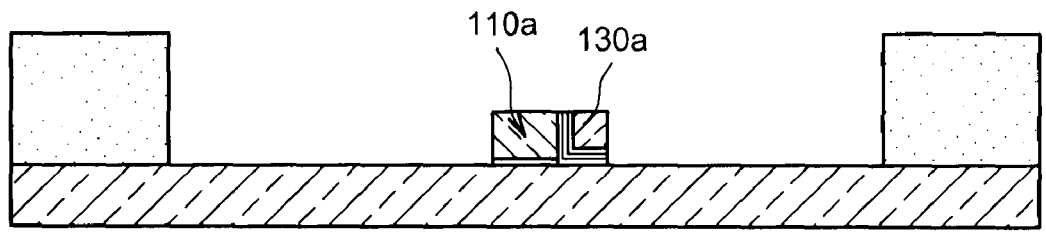
Figure 1P:
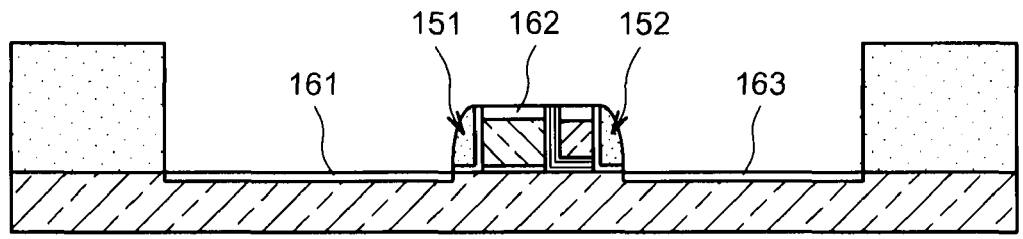
Figure 2A:
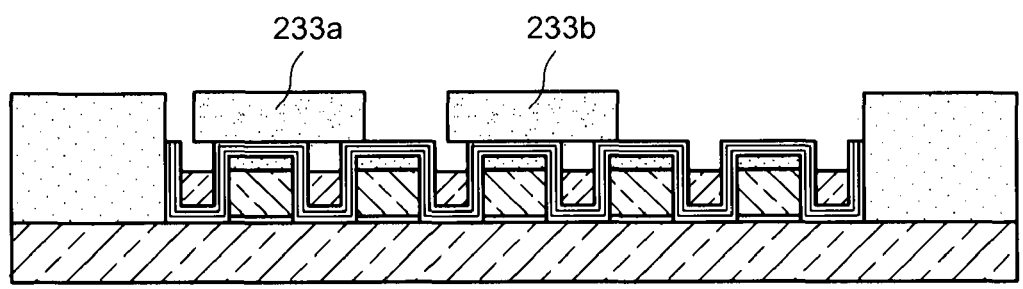
Figure 2B:
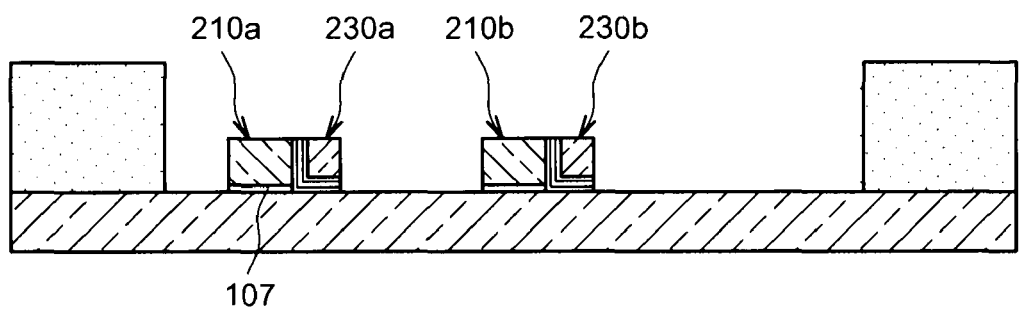
Figure 3A:
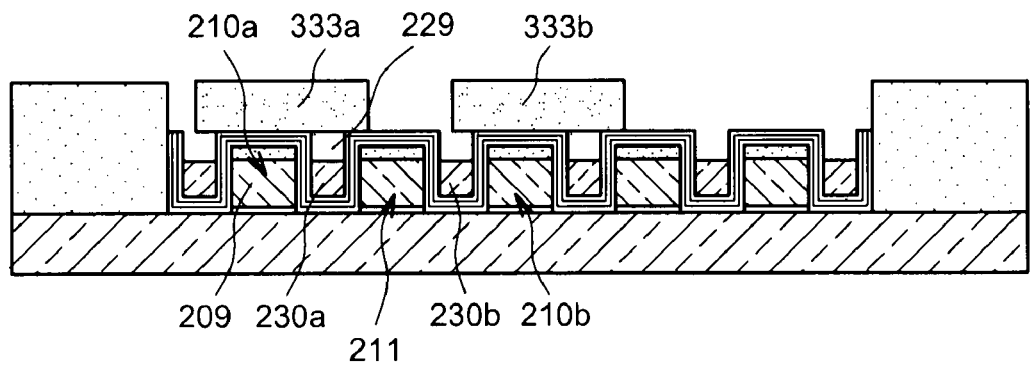
Figure 3B:
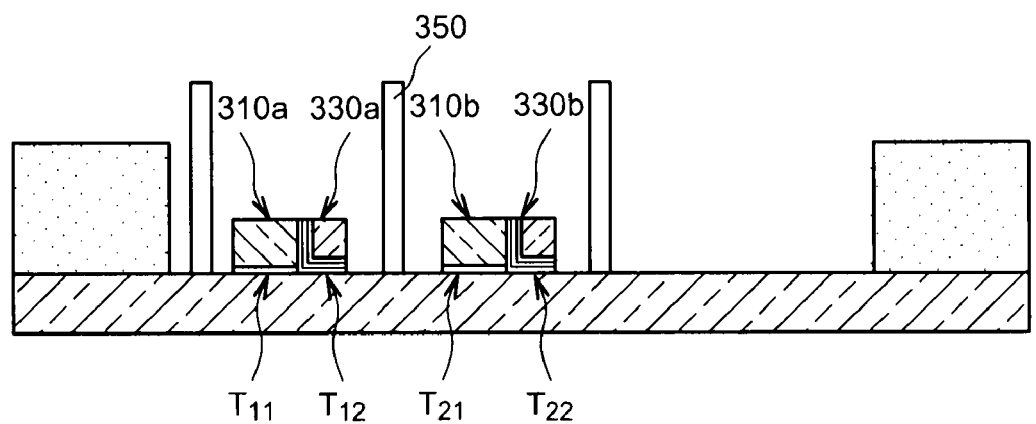
Figure 4A:
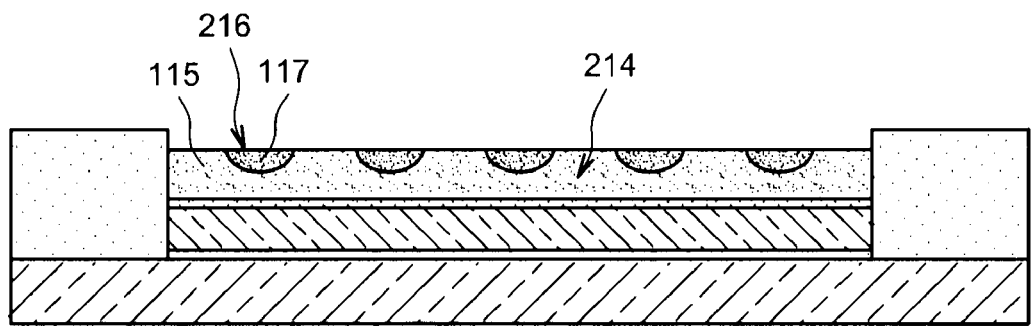
Figure 4B:
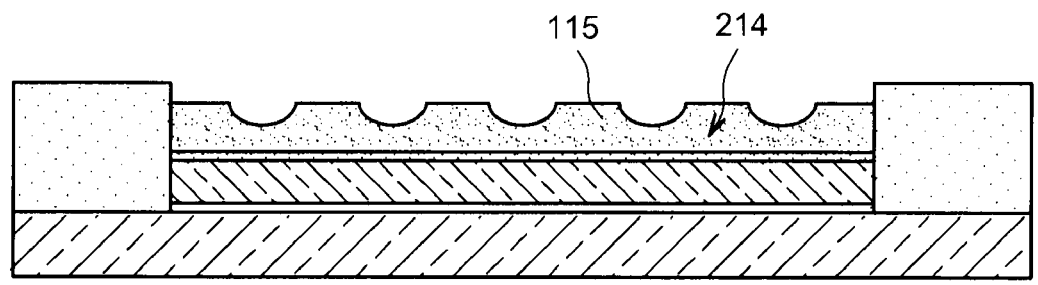
Figure 4C:
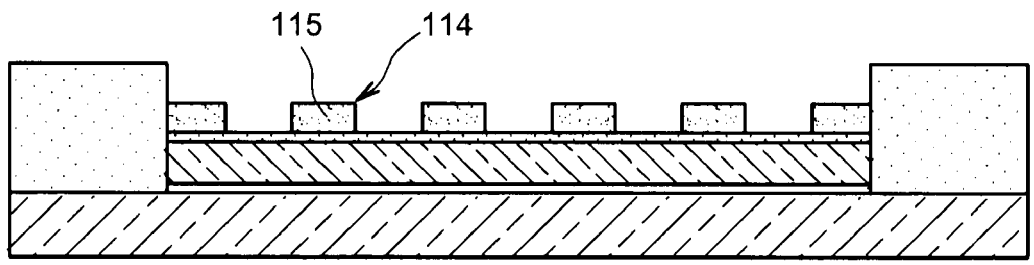

The present invention will be better understood upon reading the description of given exemplary embodiments, purely as an indication and by no means as a limitation, with reference to the appended drawings wherein:

FIGS. 1A-1P illustrate a first exemplary method according to the invention, for making a micro-electronic non-volatile memory device with transistors provided with gates placed side by side, FIGS. 2A-2B illustrate an alternative embodiment wherein several pairs of transistors with gates placed side by side are made at the same time, FIGS. 3A-3B illustrate an alternative of the exemplary method wherein several pairs of transistors with gates placed side by side are formed, each pair of transistors comprising a memory transistor, the pairs being laid out so that their memory transistors are laid out and may be set to a common source potential, FIGS. 4A-4C illustrate an alternative embodiment of masking patterns, applied during a method according to the invention, FIGS. 5A-5E illustrate another exemplary method according to the invention, which differs from the first example notably because of the order in which the gates of the transistors are made.

Identical, similar or equivalent parts of the different figures bear the same numerical references so as to facilitate passing from one figure to the other.

The different parts illustrated in the figures are not necessarily illustrated according to a uniform scale, in order to make the figures more legible.

DETAILED DISCUSSION OF PARTICULAR EMBODIMENTS

An exemplary method for making, according to the invention, a micro-electronic device with transistors including gates placed side by side will now be given in connection with FIGS. 1A-1P. The micro-electronic device may be a non-volatile memory cell, such as for example a flash memory.

On a support 100, first of all, a cavity 103 is made in an insulating layer 102 lying on the support 100. The cavity 103 may for example have a rectangular shape and may for example be made with a method commonly called "shallow trench isolation". The insulating layer 102 may for example be based on $SiO_2$. The cavity 103 may be made with a critical dimension dc (measured in a direction parallel to the support 100 and to the vector $\vec{i}$ of an orthogonal reference system [O; $\vec{i}$; $\vec{j}$; $\vec{k}$] defined in FIG. 1A) which may for example be of the order of 1 μm. By <<critical dimension>>, is meant the smallest dimension of a pattern made in a layer or a stack of layers, except for its height or its thickness. The cavity 103 is formed facing a semiconducting area 101 in which one or more active transistor areas are intended to be made (FIG. 1A).

Next (FIG. 1B), a gate stack is formed in order to make one or more gates of transistor(s) of a first type, for example transistor(s) for selecting or accessing the memory cell. The gate stack comprises a dielectric gate layer 107, which may for example be made by thermal oxidation of the semiconducting area 101. The dielectric gate layer 107 may have a thickness for example of the order of 5 nm. The gate stack also comprises a layer of gate material 109 on the dielectric layer 107, for example a layer of polysilicon which may be doped, according to N type doping. The layer of gate material 109 may have for example a thickness of 100 nanometers (FIG. 1B).

And then (FIG. 1C), a hard mask layer 113, for example based on $SiO_2$, or on $HfO_2$, or on $Al_2O_3$, is formed on the layer of gate material 109.

The hard mask layer 113 may be used for protecting the layer of gate material 109 during subsequent etching of the latter.

A step of preparing the surface of the hard mask layer 113 so as to create OH sites on the latter can be achieved, for example by treatment with HF when the hard mask layer 113 is made of $SiO_2$.

Next, in the cavity 103, a masking layer is made, comprising a plurality of blocks 114 of critical dimension $l_1$ based on a first polymer 115 and a plurality of blocks 116 of critical dimension $l_2$ based on another polymer 117 (the respective critical dimensions $l_1$, $l_2$ being measured in a direction parallel to the vector $\vec{k}$ of an orthogonal reference system [O; $\vec{i}$; $\vec{j}$; $\vec{k}$] defined in FIG. 1D). The dimensions $l_1$, $l_2$ of the blocks 114 and 116 are provided depending on the dimensions with which it is desired to form the gates of the memory device, and may be equal to those provided for at least one first gate and at least one second gate of the memory device respectively. The dimensions $l_1$, $l_2$, may for example be comprised between 15 nanometers and 40 nanometers.

The masking layer may be based on a block copolymer material and in particular a diblock copolymer material is used. A diblock copolymer material is a material containing a combination of two polymers 115 and 117 of different chemical natures bound to each other, and the distribution of which is made according to a regular periodic structure.

This regular periodic distribution is used for forming patterns of a mask having a regular distribution.

According to a possible application, the blocks 114, 116 may be made so as to have a parallelepipedal shape and to be parallel with each other.

The surface treatment of the hard mask layer 113 can favorize the organization of the co-polymers blocks.

In order to obtain parallelepipedal blocks, the composition of the diblock copolymer may be controlled: for example so that it consists of the order of 50% of polymer block 115 and of the order of 50% of polymer block 117, which leads to an organization of the copolymer in parallelepipedal lamellas as illustrated in FIG. 1D.

The diblock copolymer material may for example be PS-b-PMMA (polystyrene-b-poly(methyl methacrylate) or PS-b-PI (polystyrene-b-polyisoprene) or PS-b-PB (polystyrene-b-polybutadiene).

In the case when the diblock copolymer material is PS-b-PMMA, the latter may have a volume fraction of the order of 0.3, a molar mass by weight of the order of 67,100 g·mol$^{-1}$ and a polymolecularity index of 1.09. The diblock polymer chains may be diluted in a solution of toluene so as to obtain a concentration for example of the order of 1% by weight, and may then be deposited with a whirler at a speed for example of the order of 3,000 rpm (revolutions/minute), an acceleration of 1,000 (revolutions/minute)·s$^{-1}$ and a duration for example of the order of 30 s. Thus, it is possible to obtain a homogeneous thickness layer of PS-b-PMMA for example of the order of 35 mm. The obtained layer is then brought in vacuo to a temperature for example of the order of 170° C. for a duration for example of the order of 48 hours.

The orientation of the PMMA blocks within the copolymer layer is governed by surface interaction effects between the different blocks and the insulating layer, in particular when it is based on silicon oxide.

This interaction may be neutralized for example by depositing a random PS-PMMA copolymer so as to form an alternation of parallelepipedal blocks as illustrated in FIG. 1D.

Next, removal of portions of the masking layer is carried out so as to retain certain masking patterns.

In the case for example when the copolymer is PS-PMMA, the removed material is PMMA. For this, removal of the blocks 116 based on the second polymer 117, selective with regard to the first polymer 115, may be applied (FIG. 1E).

According to another example, in the case of a PS-b-PI system, this selective withdrawal may be carried out by using a treatment with ozone, with which the polyisoprene (PI) blocks may be selectively degraded with respect to the polybutadiene (PB) blocks.

In the case of a PS-b-PMMA system, it is also possible to selectively etch PS blocks with respect to PMMA blocks. For this, a plasma etching method in two steps using a $CF_4$ plasma and then an $O_2$ plasma may be used.

In the case when the copolymer is PS-b-PMMA, it is also possible to proceed with selective removal of PMMA blocks in a diblock copolymer of the PS-b-PMMA type by using UV radiation. These UV radiations generate preferential splitting of the PMMA chains. The removal of PMMA blocks may be carried out for example by exposing the copolymer layer to HgXe ultraviolet illumination for example at a dose of the order of 1.2 J·cm$^{-2}$ for a duration e.g. of the order of minutes, by immersion in an acetic acid bath for 10 minutes, and then by a rinse with de-ionized water. For the purpose of removing residual elements of the blocks 116 of polymer 117, etching may be carried out in a plasma, in particular an inductive coupling plasma (ICP), for example at 4.2 mTorrs, and based on Ar at 50 sccm (<<standard cubic centimeters per minute>>) and $O_2$ at 5 sccm, with a source power which may for example be of the order of 70 W, the exposure may have e.g. a duration of the order of 15 seconds.

At the end of this selective removal, parallelepipedal blocks 114 of polymer 115, regularly distributed over the gate stack (FIG. 1E) are obtained.

According to an alternative embodiment (FIGS. 4A-4C) it is also possible to use an asymmetrical copolymer, the proportion of which in polymer 115 and in polymer 117 is different from 50/50.

With such a copolymer, it is possible to form a plurality of blocks 216 based on the second polymer 117 which are cylindrical or which have a circular or oval section, in a layer 214 based on the first polymer 115, and they extend parallel to the substrate FIG. 4a). In the case of a PS-PMMA copolymer, such a layout may be obtained with for example 30% PMMA and 70% PS.

The PMMA blocks 216 may then be removed by combining treatments based on acetic acid and on Ar $O_2$ plasma etching (FIG. 4B).

Thinning of the remaining PS layer 215, for example by anisotropic etching with Ar $O_2$, is carried out so as to obtain parallelepipedal blocks 214 of polymer 115, regularly distributed over the gate stack (FIG. 4C).

Etching of the gate material 109 is then carried out by using the blocks 114 or 214 of polymer 115 as an etching mask.

In the case of a polysilicon gate, this etching may be carried out for example by dry etching of the polysilicon by using the blocks 114 or 214 of polymer 115 as an etching mask and the gate dielectric 107 as an etching stop layer. Thus, the layer of gate material 109 is etched so as to form gate blocks 110 for transistors of a first type, for example gates of transistors for selecting or accessing the memory cell (FIG. 1F).

During this etching, the blocks 114 or 214 of polymer 115 may be partly consumed (FIG. 1F).

According to an alternative (not shown), this etching may be carried out so that at the end of the latter, the blocks 114 of polymer 115 are entirely consumed. With the hard mask 113, it is then possible to protect the blocks 110 based on the first gate material 109 during the etching.

In a case when at the end of the etching the blocks 114 are not entirely consumed, removal of the polymer 115 is carried out for example with an $O_2$ plasma.

Once the etching has been carried out, a plurality of distinct blocks 110 based on the first gate material 109 is obtained, separated from each other by an empty space 119, and distributed according to a regular pitch on the dielectric layer 107. Among these distinct blocks 110 based on the first gate material 109, at least one block 110a is intended to form a transistor gate, while one or more blocks are intended to be suppressed subsequently.

The dielectric layer 107 may be etched through said hard mask so as to only be retained under the gate blocks 110 (FIG. 1G).

One or more gates of transistors of a second type, for example memory storage transistors, are then made.

For this, first of all, a three-layer insulating stack 121, 122, 123 such as an ONO stack, is formed in the cavity 103.

The three-layer insulating stack 121, 122, 123 may be made by conformable deposition so as to cover the blocks 110.

For this, a dielectric material layer, 121, for example based on silicon oxide and with a thickness e.g. of the order of 6 nanometers, is, first of all, deposited. Next, a charge-trapping layer is formed, which may be based on a dielectric material 122, for example such as silicon nitride, and with a thickness e.g. of the order of 6 nanometers.

And then, another silicon oxide layer 123, e.g. of the order of 8 nanometers thick, is made.

By removing the dielectric gate layer 107 between gate blocks 110, a specific and good quality gate dielectric material can be formed for the second gates.

Next, a gate material 129 is deposited in the cavity 103. The gate material 129 may be deposited according to a non-conformable deposition, so as to fill the spaces 115 separating the gate blocks 110. The material 129 may be deposited so as to cover the gate blocks 110 covered by the ONO stack 121-122-123. The material 129 may for example be polysilicon, in particular polysilicon doped with a type N dopant (FIG. 1I).

And then partial removal of the gate material 129 is carried out by anisotropic etching.

This etching may be dry etching, for example achieved with HBr—Cl, or for example wet etching, for example with TMAHi (TetraMethyl Ammonium Hydroxide). The removal is carried out so as to preserve the blocks 130 of gate material 129 on either side of the blocks 110 of gates of selection transistor(s). The removal may be carried out so that the blocks 130 of gate material 129 have a height equal to or substantially equal to or close to that of the blocks 110 (FIG. 1J).

Next, a mask 133 for example based on resin, is formed, which covers at least a first given block 110a among the gate blocks 110 of the selection transistors, and at least one other block 130a among the gate blocks 130 of the memory storage transistors, the other block 130a being adjacent to said first given block and separated from the latter by the ONO stack. The resin mask 133 may be made by photolithography. In this exemplary embodiment, exact alignment of the resin mask 133 with the first block 110a and the second block 130a is not indispensable. Thus, the mask 133 may optionally be formed so as to partially jut out vertically below another block among the blocks 130, and may also lie on at least one other given block among said blocks 110. Thanks to the precise positioning of the blocks 110 and 130, the positioning constraint of the mask 133 is diminished. The protruding length Δ of the mask 133 over said block among the blocks 130 may be below the critical dimension $l_2$ (FIG. 1K).

The photolithography method for producing the mask may be provided with a larger misalignment tolerance than in the methods according to the prior art, and which depends on the size of the gates, the formation of which is desired.

Next, removal of the gate material 129 of the memory device is performed outside the areas protected by the resin mask 133, for example by using TMAH. Stopping the etching is performed on the upper layer of the stack of layers 121-122-123 (FIG. 1L). The removal of the stack of layers 121-122-123 may, first of all, be achieved by etching for example with HF in order to remove the dielectric layer 121, when the latter is based on $SiO_2$. Next, in order to remove the layer 122, it is possible to carry out etching with the acid $H_3PO_4$ when the latter is based on $Si_3N_4$. And then, removal of the layer 123 may be achieved by etching for example with HF, when the latter is based on $SiO_2$. The removal of the layer 123 may be carried out so as to retain at least one portion of the dielectric gate layer 107 on the semiconducting area 101.

At the end of this removal, the first block 110a and the second block 130a are covered on the top and on their side flanks, by the ONO stack 121, 122, 123.

Next, removal of blocks 110b based on the first gate material 109 from the dielectric 107 is carried out outside the areas protected by the resin mask 133. For this, selective and isotropic chemical etching based on TMAH may be used for etching the gate block 110b which is neither entirely covered by the mask 133 nor entirely covered by the stack of layers 121-122-123, the semiconducting area 101 being protected by the dielectric layer 107. The hard mask 113 is also removed during this etching (FIG. 1N).

Next, removal of the resin mask 133 is carried out.

And removal of the stack of layers 121, 122, 123 is then carried out on the gate blocks 110a, 130a, which were protected by the resin mask 133.

For example, for an ONO i.e. "Oxide", "Nitride", "Oxide", stack, it is possible to use the acid HF for removing the silicon oxide layer 123, and then the acid $H_3PO_4$ for removing the silicon nitride layer 122, and then the acid HF for removing the silicon oxide layer (FIG. 1O).

Removal of the hard mask layer 113 on the first block 110a is also achieved. In the case when the hard mask layer 113 is based on $Al_2O_3$ or $HfO_2$, $BCl_3$—Cl may be used for removing the hard mask. When the hard mask layer 113 is formed on the basis of $SiO_2$, this removal may for example be carried out at the same time as that of the silicon oxide layer 121.

And doping of the active areas of the transistors may then be carried out for example by implantation, and then by producing spacers 151, 152 on either side of the adjacent gate blocks 110a, 130a.

Another step for implanting the active area is then carried out.

Silicidation of the gates and of the active areas may then be carried out, in order to form areas, 161, 162, 163 for a contact point, active areas and of the gate (FIG. 1P).

One or more interconnection levels of the transistors may then be achieved.

FIGS. 2A-2B illustrate an alternative embodiment wherein, after the step described earlier in connection with FIG. 1J, several resin masks 233a, 223b of the type of the mask 133 are formed.

The masks 233a, 223b may be separated by a distance equal to the sum of the critical dimension $l_1$ of a block 116 of polymer 117 and of the critical dimension $l_2$ of another block 114 of polymer 115. The mask 233a lies on a gate block 210a formed on the basis of the gate material 109 and on another block based on the first gate material 109, which is intended to be suppressed. The mask 233b lies on a gate block 210b formed on the basis of the first gate material 109 and on another block based on the first gate material 109, which is intended to be suppressed.

Successive etchings are then carried out through these masks 233a, 233b so as to remove the gate material 129, the stack of layers 121-122-123, and the gate material 109 outside the masks.

Another alternative of the method described earlier is given in FIGS. 3A-3B. For this alternative, a first mask 333a, is formed on a first block 210a of material 209 and above a second block 230a of gate material 229. The mask 333a also lies on a portion of a sacrificial block 211 of gate material 209. A second mask 333b, is formed on a block 210b of material 209 and above a block 230b of gate material 229. The mask 333a also lies on a portion of the sacrificial block 211, which separates the blocks 230a and 230b based on the gate material 229.

Successive etchings are then carried out through these masks 333a, 333b so as to remove the gate material 129, the stack of layers 121-122-123, and the gate material 109 outside the masks.

In this way a pair of transistors $T_{11}$ and $T_{12}$ with adjacent gates 310a and 330a may be made which share a common electrode with another pair of transistors $T_{21}$ and $T_{22}$ with adjacent gates 310c and 330c. Each pair of transistors comprises an access transistor $T_{11}$ or $T_{22}$ and a memory storage transistor $T_{12}$ and $T_{21}$, the memory storage transistors being formed so as to be adjacent and to share a common contact 350 and a common source area to which this contact 350 is connected.

According to an alternative of the making method described in connection with the figures (FIGS. 5A-5D), the order for making the gate blocks 110a and 130a may be reversed.

Figure 5A:
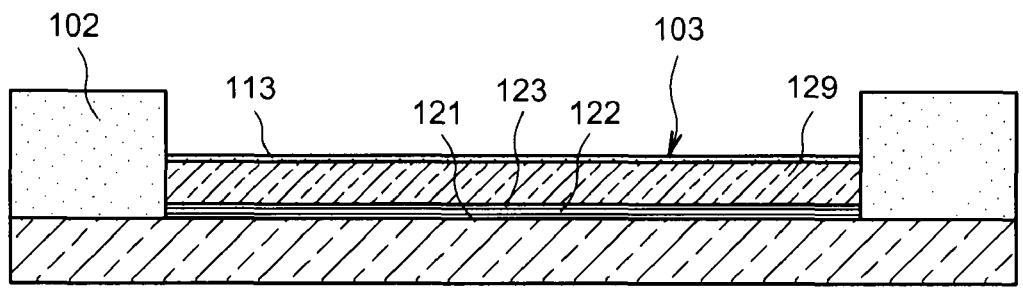

Thus, first of all, the three-layer stack 121, 122, 123, is made in the cavity 103, and then deposition of the gate material 129 (FIG. 5A).

Figure 5B:
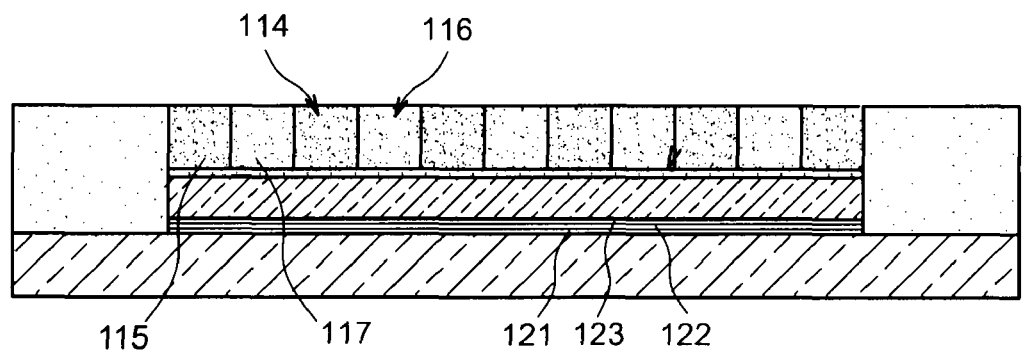

Next, the hard mask 113 is formed and then the diblock copolymer layer with an alternation of blocks 114 of polymer 115 and of blocks 116 of polymer 117 (FIG. 5B).

Regularly distributed gate blocks 130a are made by etching the gate material 129 and the three layers 121-122-123 through polymer patterns 115.

Figure 5C:
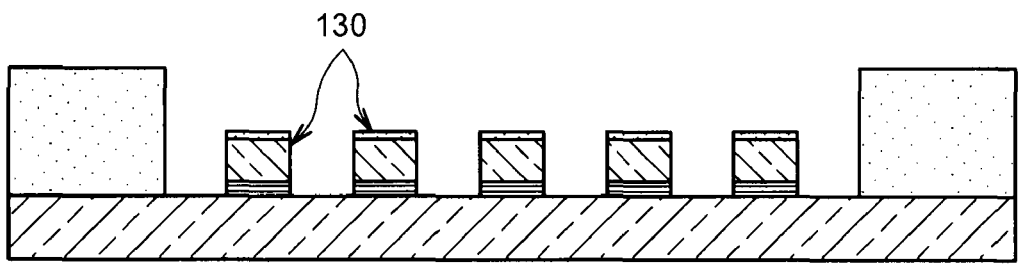

And then, these polymer patterns 115 are removed (FIG. 5C).

Figure 5D:
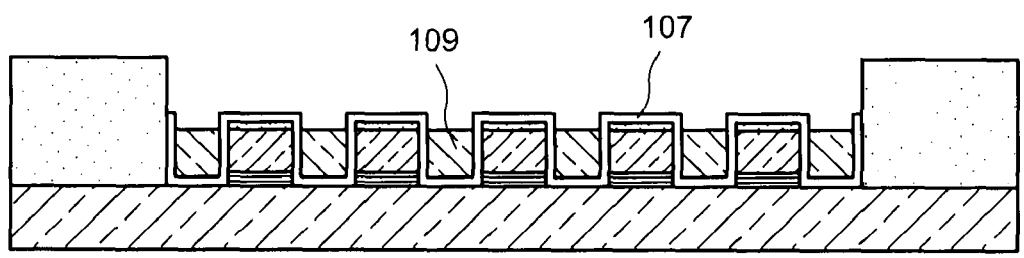

A gate stack is then made, formed with the dielectric 107 and with the gate material 109, between the regularly distributed blocks 130a (FIG. 5D).

Figure 5E:
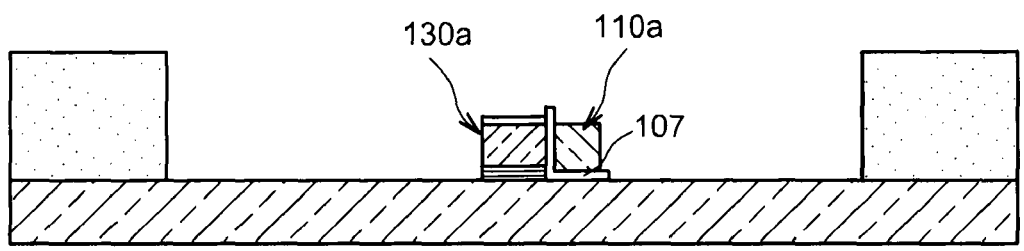

Etching is then carried out through a resin mask in order to make the gate block 110a adjacent to the block 130a, and to remove the sacrificial gate blocks (FIG. 5E).

The invention claimed is:

1. A method for making a micro-electronic non-volatile memory device provided with transistors having gates placed side by side, the method comprising the steps of:
    forming a diblock copolymer layer above a layer based on a first gate material,
    selectively removing in the diblock copolymer layer, blocks based on a polymer of said copolymer, so as to retain at least one given pattern and at least one other given pattern separated by a given distance of said given pattern, said patterns being based on another polymer of said copolymer, the method further comprising the steps of:
    a) forming, by etching said first gate material through said given pattern and said other given pattern, of at least one first transistor gate block and at least one sacrificial block, said first block and said sacrificial block being separated by a given space,
    b) forming in said given space at least one insulating layer and a second gate material, said second gate material in said space forming another gate block separated from the first block by said insulating layer,
    c) suppressing said sacrificial block.

2. The method according to claim 1, further comprising between step b) and step c), the steps of:
    formation of at least one mask covering said first gate block and said other gate block, the mask being formed to cover part of the sacrificial block on one side of the first gate block and extending beyond another side of the first gate block,
    successive etchings through said mask, of the second gate material, the insulating layer,
    the sacrificial block being removed in step c) by etching through said mask.

3. The method according to claim 1, wherein the layer based on the first gate material is formed on a gate dielectric layer formed on a support, the diblock copolymer layer being formed on a hard mask layer formed on said first gate material layer, the etching in step a) being realized through said hard mask,
    the method further comprising: between step a) and step b), withdrawal of the gate dielectric layer between the first block and said sacrificial block by etching through said hard mask.

4. The method according to claim 1: the given pattern and said other given pattern being parallelepipedal.

5. The method according to claim 1, the diblock copolymer being selected from one of the following materials: PS-b-PMMA, PS-b-PI.

6. The method according to claim 1, wherein said insulating layer is formed with a stack comprising:
    at least one first dielectric material layer,
    at least one layer for storing charges, formed on said first dielectric material layer,
    at least one second dielectric material layer formed on said charge storage layer.

7. The method according to claim 6, wherein step b) comprises steps for:
    conformable deposition of said insulating layer on said first block of said first gate material,
    deposition of said second gate material so as to fill said given space.

8. The method according to claim 2, further comprising, after step c), the steps for:

removing the mask,
partially removing the insulating layer, the insulating layer being retained between said first gate block and said other gate block and under said other gate block.

9. The method according to claim 1, wherein a support comprises a semiconducting area in which the channels of said transistors are provided, the semiconducting area being covered with a gate dielectric area, and then with said layer of said first gate material.

10. The method according to claim 9, wherein the gate dielectric area and said layer of said first gate material are formed in a cavity made in an insulating layer lying on the support.

11. The method according to claim 1,
step a) comprising the formation in said layer based on said first gate material lying on a support, of at least one second transistor gate block, said second block and said sacrificial block being separated by another given space, said sacrificial block being located between said first block and said second gate block,
step b) comprising the formation in said other given space of a stack comprising said insulating layer and said second gate material, said second gate material located in said other space forming a gate block adjacent to said second block and separated from said second block by said insulating layer.

12. The method according to claim 11, wherein said other gate block adjacent to the first gate block is a gate block of a first memory storage transistor, said gate block adjacent to the second gate block is a gate block of a second memory storage transistor and is juxtaposed to said other gate block, the method further comprising the formation of a common contact area between the first memory storage transistor and said second memory storage transistor.

* * * * *